(12) United States Patent
Kwak

(10) Patent No.: US 7,611,962 B2
(45) Date of Patent: Nov. 3, 2009

(54) METHOD FOR FABRICATING SEMICONDUCTOR DEVICE

(75) Inventor: Sung Ho Kwak, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,772

(22) Filed: Dec. 30, 2005

(65) Prior Publication Data

US 2007/0117346 A1    May 24, 2007

(30) Foreign Application Priority Data

Nov. 24, 2005    (KR) .................... 10-2005-0112998

(51) Int. Cl.
*H01L 21/76*    (2006.01)
(52) U.S. Cl. ............... 438/424; 438/427; 257/E21.549
(58) Field of Classification Search ............... 438/403, 438/404, 424, 425, 427
See application file for complete search history.

(56) References Cited

U.S. PATENT DOCUMENTS

| | | | | |
|---|---|---|---|---|
| 4,857,477 A | * | 8/1989 | Kanamori | 438/386 |
| 5,674,775 A | * | 10/1997 | Ho et al. | 438/296 |
| 5,801,083 A | * | 9/1998 | Yu et al. | 438/424 |
| 5,989,975 A | * | 11/1999 | Kuo | 438/424 |
| 6,096,612 A | * | 8/2000 | Houston | 438/296 |
| 6,225,187 B1 | * | 5/2001 | Huang et al. | 438/424 |
| 6,228,727 B1 | * | 5/2001 | Lim et al. | 438/296 |
| 6,228,747 B1 | * | 5/2001 | Joyner | 438/436 |
| 6,555,442 B1 | * | 4/2003 | Pai et al. | 438/424 |
| 6,914,009 B2 | * | 7/2005 | Lill et al. | 438/711 |
| 2005/0064678 A1 | * | 3/2005 | Dudek et al. | 438/424 |

FOREIGN PATENT DOCUMENTS

KR    10-2003-0001875 A    1/2003

\* cited by examiner

*Primary Examiner*—Walter L Lindsay, Jr.
*Assistant Examiner*—Reema Patel
(74) *Attorney, Agent, or Firm*—McKenna Long & Aldridge LLP

(57) ABSTRACT

A method for fabricating a semiconductor device can prevent a leakage current and the decrease of threshold voltage by rounding corners of a trench. The method may include the steps of forming a pad insulating layer in a semiconductor substrate defined with an active region and a device isolation region, forming a first trench, forming polymer at inner sidewalls of the first trench, forming a second trench, removing the polymer, forming an oxide layer by thermally oxidizing the semiconductor substrate, and forming insulating layers for device isolation in the first and second trenches.

3 Claims, 7 Drawing Sheets

METHOD FOR FABRICATING SEMICONDUCTOR DEVICE

This application claims the benefit of Korean Patent Application No. 10-2005-0112998, filed on Nov. 24, 2005, which is hereby incorporated by reference for all purposes as if fully set forth herein.

BACKGROUND OF THE INVENTION

1. Field of the Invention

The present invention relates to a method for fabricating a semiconductor device. More particularly, the present invention relates to a method for fabricating a semiconductor device that can improve the efficiency of the device by rounding corners of a trench used in forming a Shallow Trench Isolation (STI).

2. Discussion of the Related Art

Generally, semiconductor devices such as memory devices and image sensors are fabricated by integrating a plurality of unit devices into a semiconductor substrate. To realize high-integration of a semiconductor device, a plurality of active regions are defined to correspond to a plurality of unit devices. Then, field regions are defined to form field oxide layers or device isolation layers.

To fabricate a semiconductor device, the field oxide layer may be formed in the field region. However, with the recent trend toward the high-integration of semiconductor devices, a trench may be formed in the field region. The trench is filled with an insulating layer, such as a TEOS layer, and then a CMP (Chemical Mechanical Polishing) process is performed so that the TEOS layer is left only inside the trench.

A method for forming the Shallow Trench Isolation according to the related art will be explained as follows.

FIGS. 1A to 1E are cross sectional views of a device fabricated by a method for forming the Shallow Trench Isolation of a semiconductor device according to the related art.

As shown in FIG. 1A, a pad insulating layer 2 is formed on a semiconductor substrate 1. Then, a photoresist 3 is formed on the pad insulating layer 2. The pad insulating layer 2 may have a stacked structure of pad oxide, pad nitride and TEOS (Tetra Ethyl Ortho Silicate) oxide.

Referring to FIG. 1B, the photoresist 3 is selectively removed by exposure and development using a mask for defining active and field regions. Then, predetermined portions of the photoresist 3 corresponding to the field regions are removed.

As shown in FIG. 1C, regions in the pad insulating layer 2 and the semiconductor substrate 1 corresponding to the field regions are etched at a predetermined depth using the patterned photoresist 3 as a mask. Trenches 4 are thereby formed.

As shown in FIG. 1D, inside each of the trenches 4, the semiconductor substrate 1 is thermally oxidized to round corners in each of the trenches 4. Accordingly, a thermal oxide layer is formed in each of the trenches 4.

As shown in FIG. 1E, the pad insulating layer 2, the photoresist 3 and the thermal oxide layer are removed. Then, an $O_3$ TEOS layer is formed in an entire surface of the semiconductor substrate 1, to fill the respective trenches 4. Then, a CMP (Chemical Mechanical Polishing) process is applied to the formed $O_3$ TEOS layer. The $O_3$ TEOS layer is left only inside the trenches 4, thereby forming the Shallow Trench Isolation 6.

Unit devices may be subsequently formed in the respective active regions which are isolated from one another by the Shallow Trench Isolation 6.

However, the method for fabricating the semiconductor device according to the related art has the following disadvantages.

In the method for fabricating the semiconductor device according to the related art, the thermal oxidation process is applied to round the corners of the trench formed in the field region. However, it is difficult to round the corners of the trench even though the thermal oxidation process is applied. Accordingly, a leakage current occurs in the corners of the trench, thereby causing deterioration in the semiconductor device.

SUMMARY OF THE INVENTION

Accordingly, the present invention is directed to a method for fabricating a semiconductor device that substantially obviates one or more problems due to limitations and disadvantages of the related art.

An advantage of the present invention is to provide a method for fabricating a semiconductor device that prevents a leakage current and the decrease of threshold voltage by rounding corners of a trench.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the invention, as embodied and broadly described, a method for fabricating a semiconductor device includes steps of forming a pad insulating layer in a semiconductor substrate defined with an active region and a device isolation region, forming a first trench, by etching the pad insulating layer and the semiconductor substrate in an area corresponding to the device isolation region to a predetermined depth, forming polymer at inner sidewalls of the first trench, forming a second trench by etching the semiconductor substrate at a predetermined depth using the polymer and the pad insulating layer as a mask, removing the polymer, forming an oxide layer by thermally oxidizing the semiconductor substrate, and forming insulating layers for device isolation in the first trench and in the second trench.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

A method for fabricating a semiconductor device according to an embodiment of the present invention will be described with reference to the accompanying drawings.

FIGS. 2A to 2J are cross sectional views of a device fabricated by a method for forming the Shallow Trench Isolation of a semiconductor device according to an exemplary embodiment of the present invention.

Figure 1A:
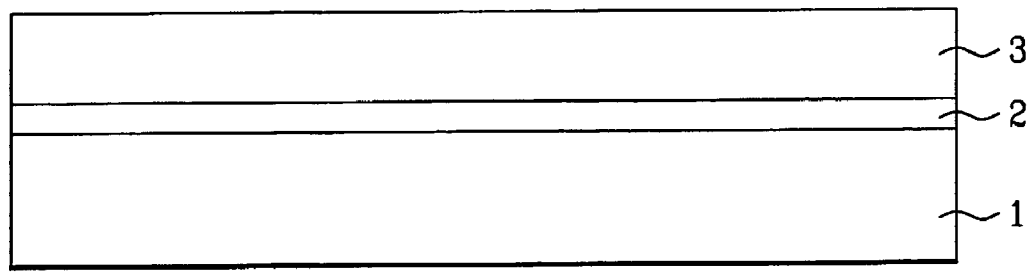
FIGS. 1A to 1E are cross sectional views of a device fabricated by a method for forming the Shallow Trench Isolation of a semiconductor device according to the related art.
Figure 1B:
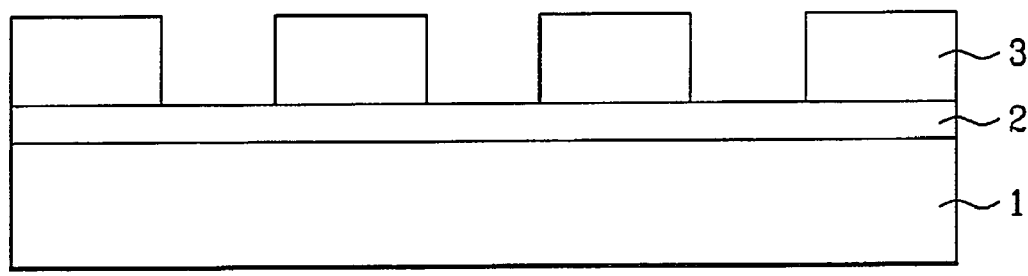
Figure 1C:
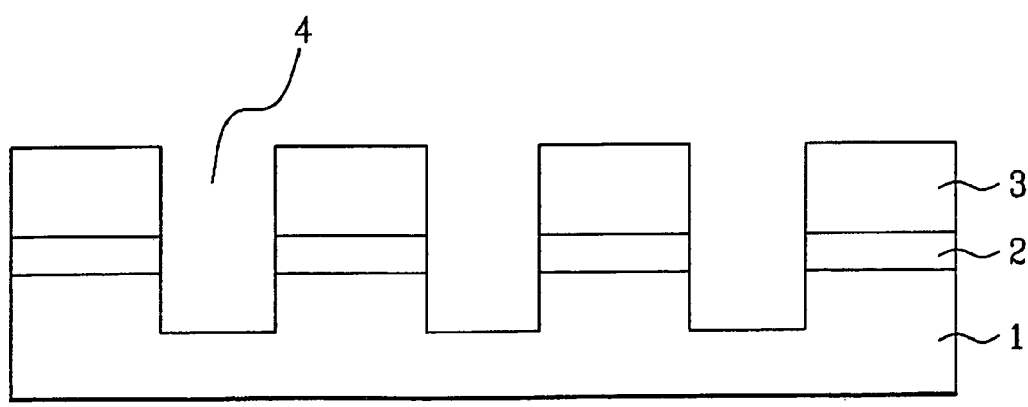
Figure 1D:
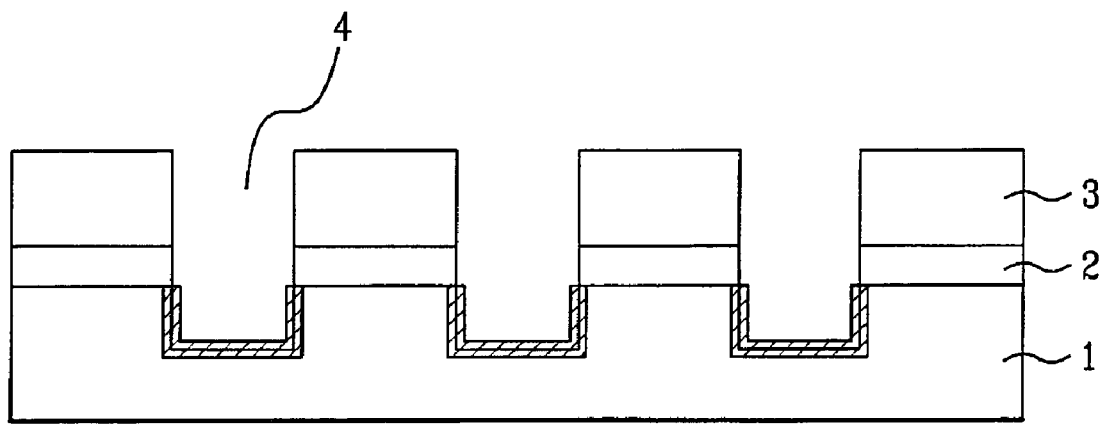
Figure 1E:
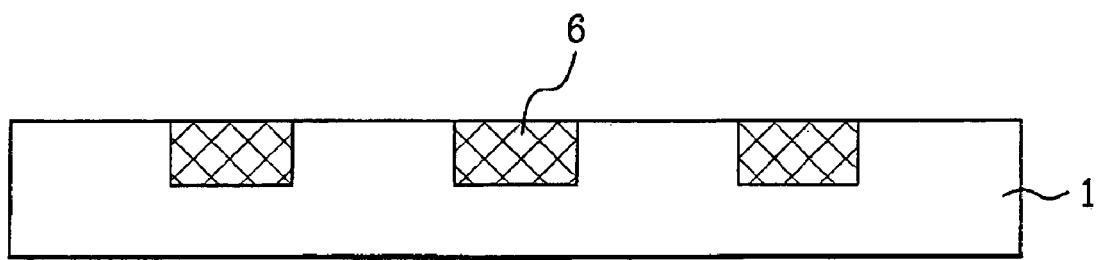
Figure 2A:
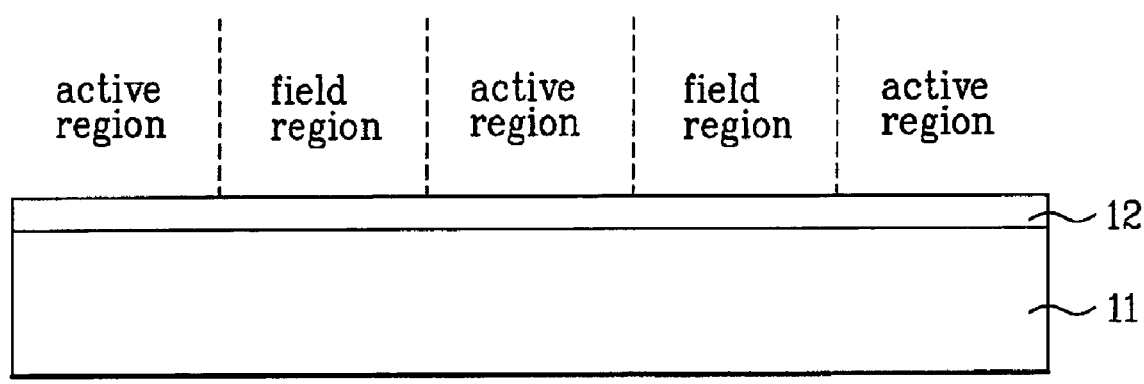
FIGS. 2A to 2J are cross sectional views of a device fabricated by a method for forming the Shallow Trench Isolation of a semiconductor device according to an exemplary embodiment of the present invention.

As shown in FIG. 2A, a semiconductor substrate 11 is defined with a plurality of active regions and a plurality of field regions. On the semiconductor substrate 11, there is a pad insulating layer 12. The pad insulating layer 12 may have a stacked structured of pad oxide, pad nitride and TEOS (Tetra Ethyl Ortho Silicate) oxide.

Figure 2B:
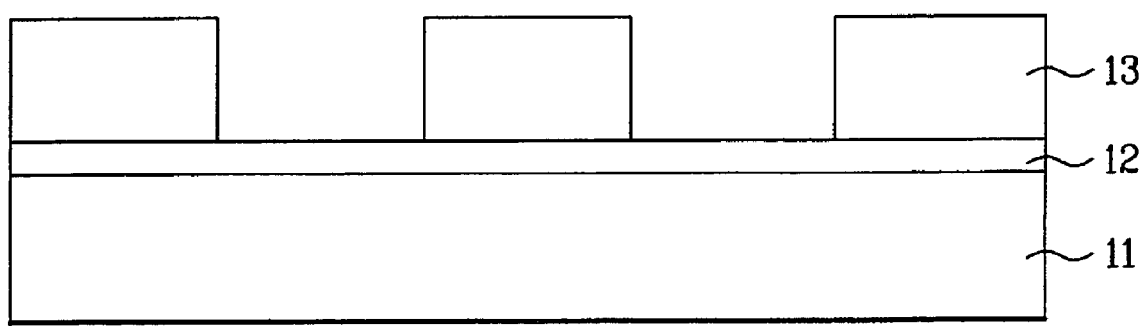

Referring to FIG. 2B, a photoresist 13 is formed on the pad insulating layer 12. Then, an exposure and development process is performed using a mask for defining the active and field regions. Predetermined portions of the photoresist 13 corresponding to the field regions are removed.

Figure 2C:
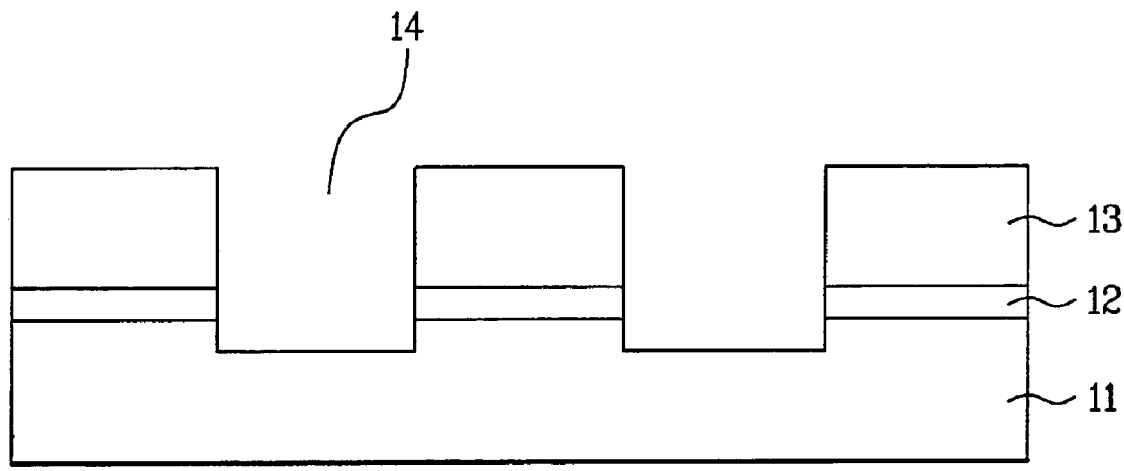

As shown in FIG. 2C, areas of the pad insulating layer 12 and the semiconductor substrate 11 corresponding to the field regions are etched to a predetermined depth using the patterned photoresist 13 as a mask. First trenches 14 are thereby formed.

Figure 2D:
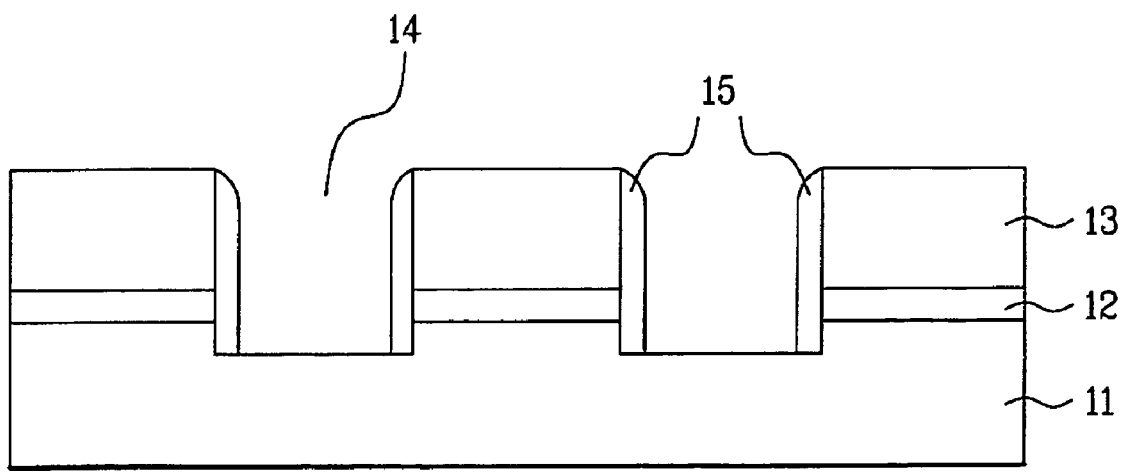

As shown in FIG. 2D, polymer 15 is formed at both inner sidewalls in each of the first trenches 14 including the patterned photoresist 13 and the pad insulating layer 12. The polymer 15 may be formed with plasma generated by fluorine gas including carbon such as $CH_2F_2$ or $C_4F_8/C_5F_8$.

Figure 2E:
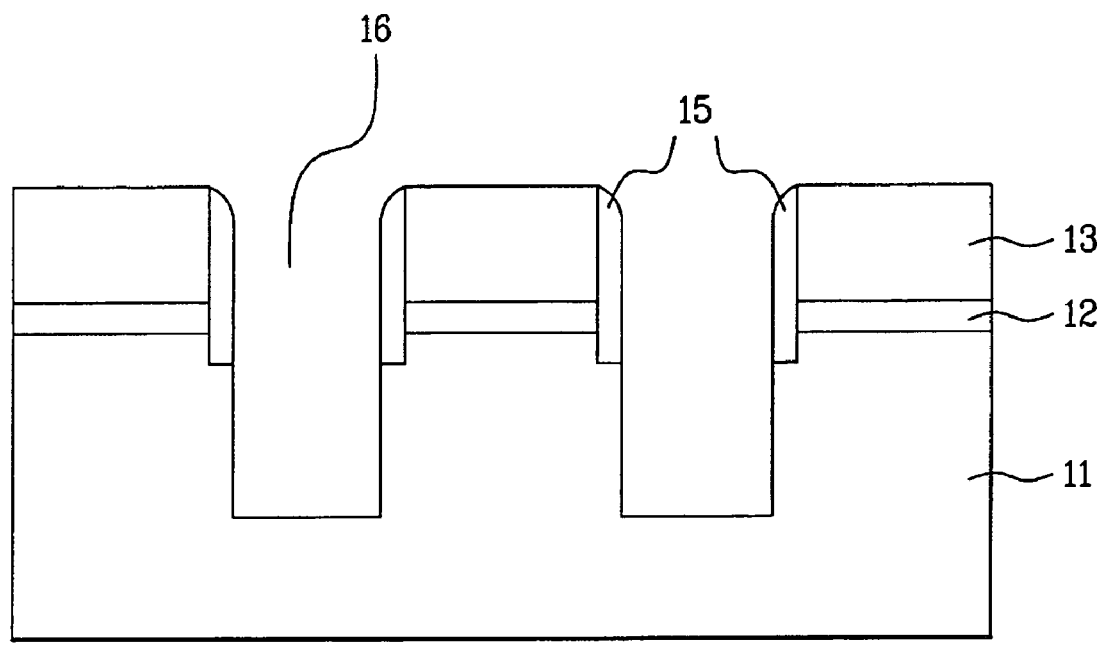

As shown in FIG. 2E, the semiconductor substrate 11 is etched to a predetermined depth using the photoresist 13 and the polymer 15 as a mask. Second trenches 16 are thereby formed.

Figure 2F:
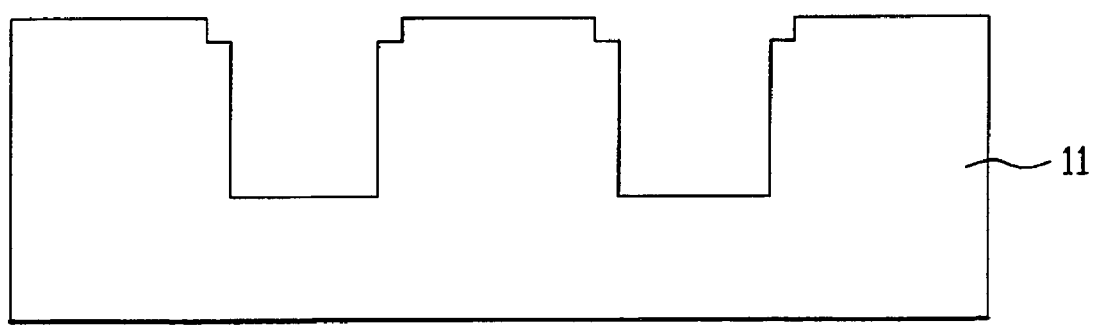
Figure 2G:
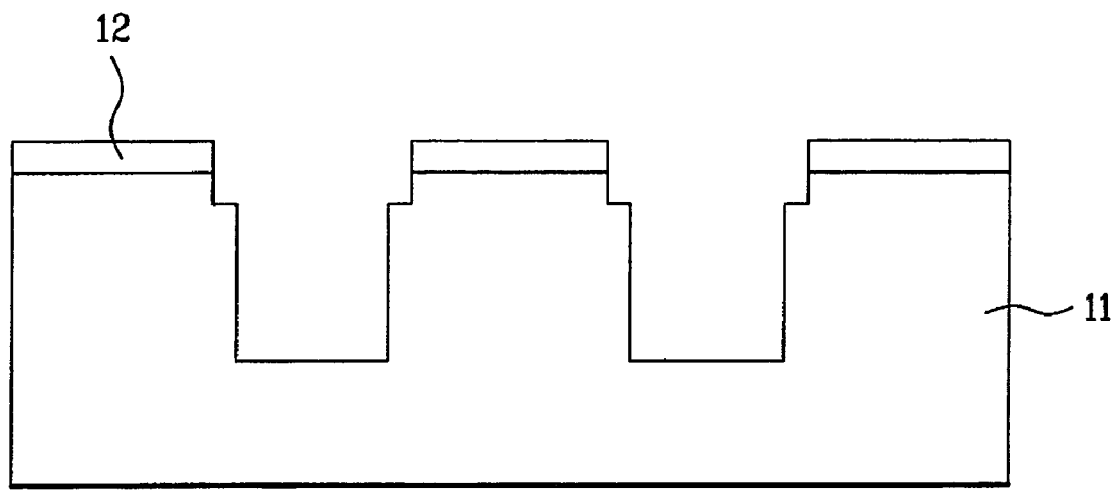

As shown in FIG. 2F and FIG. 2G, the photoresist 13, the polymer 15 and the pad insulating layer 12 are removed. Alternatively, as shown in FIG. 2G, the pad insulating layer 12 may remain.

Figure 2H:
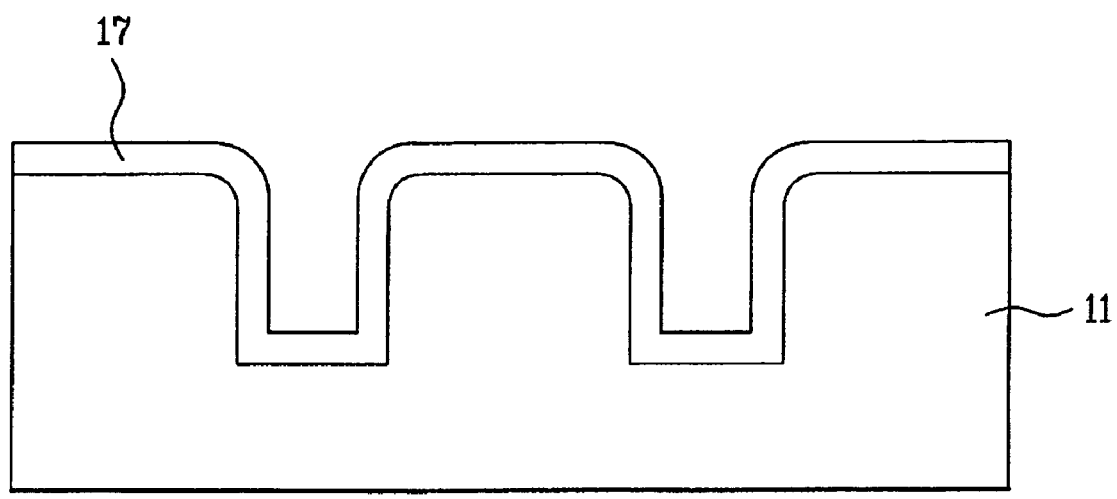
Figure 2I:
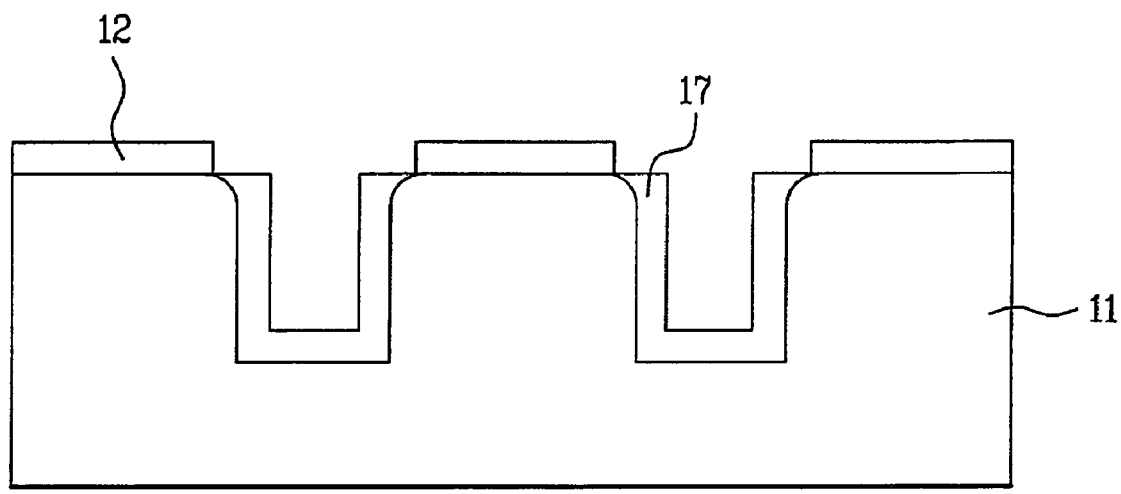

Referring to FIG. 2H and FIG. 2I, the semiconductor substrate 11 including the first and second trenches is thermally oxidized so as to round the corners of the first and second trenches 14 and 16. A thermal oxide layer 17 is formed on inner surfaces of the first and second trenches 14 and 16 and the surface of the semiconductor substrate 11 (see FIG. 2H) or on inner surfaces of the first and second trenches 14 and 16 (see FIG. 2I).

Figure 2J:
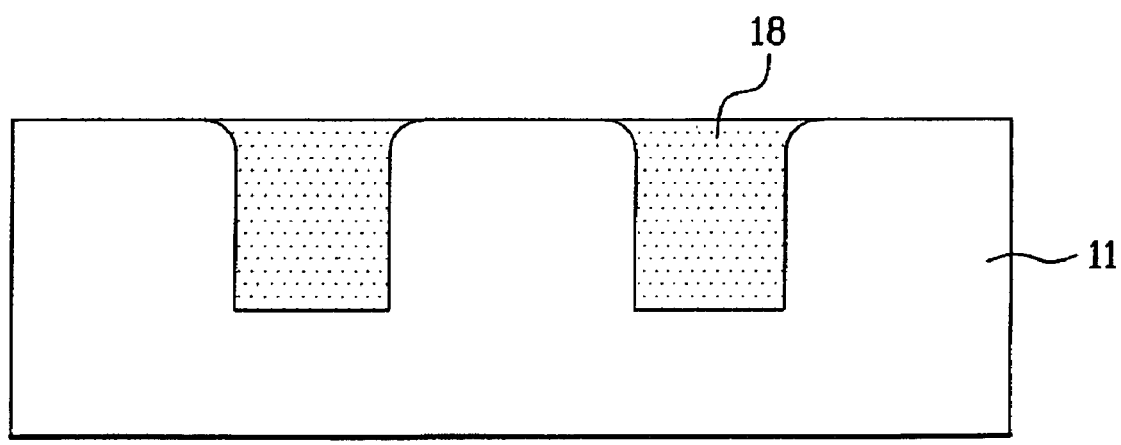

Referring to FIG. 2J, after removing the pad insulating layer 12 and the thermal oxide layer 17, an $O_3$ TEOS layer or an HDP (High Density Plasma) oxide layer is formed on the entire surface of the semiconductor substrate 11 to fill the first and second trenches 14 and 16. Then, the $O_3$ TEOS layer or the HDP (High Density Plasma) oxide layer is selectively removed by CMP (Chemical Mechanical Polishing), whereby the $O_3$ TEOS layer or the HDP (High Density Plasma) oxide layer remains only inside the first and second trenches 14 and 16. A Shallow Trench Isolation 18 is thereby formed.

In another exemplary embodiment of the present invention, before removing the pad insulating layer 12 and the thermal oxide layer 17, the $O_3$ TEOS layer or the HDP (High Density Plasma) oxide layer is formed on the entire surface of the semiconductor substrate 11 to fill the first and second trenches 14 and 16. Then, the $O_3$ TEOS layer or the HDP (High Density Plasma) oxide layer, the pad insulating layer and the thermal oxide layer 17 are removed to expose the surface of the semiconductor substrate 11 corresponding to the active regions, thereby forming the Shallow Trench Isolation 18.

Unit devices may be formed in respective active regions which are isolated from one another by the Shallow Trench Isolation 18.

As mentioned above, the method for fabricating the semiconductor device has the following advantages.

In exemplary embodiments for fabricating the semiconductor device according to the present invention, the first trench is formed in the device isolation region, and the polymer is formed at the inner sidewall of the first trench. Then, the second trench is formed in the device isolation region using the polymer as a mask. That is, the corner of the trench is formed in the shape of a step. Then, after forming the corner in the shape of a step, the corner of the trench is rounded by thermally oxidizing the semiconductor substrate.

Accordingly, it is possible to prevent a leakage current and the decrease of threshold voltage in the corner of the trench in the active region. Thee efficiency of the semiconductor device is thereby improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device comprising:

forming a pad insulating layer on a semiconductor substrate defined with an active region and a device isolation region;

forming a first trench by etching the pad insulating layer and the semiconductor substrate corresponding to the device isolation region to a predetermined depth;

forming polymer on sidewalls of the first trench, wherein the polymer is formed by generating plasma with fluorine gas including carbon;

forming a second trench by etching the semiconductor substrate to a predetermined depth using the polymer and the pad insulating layer as a mask;

removing the polymer and the pad insulating layer;

forming an oxide layer on an entire surface of the semiconductor substrate by thermal-oxidizing the semiconductor substrate; and forming an insulating layer for device isolation in the first and second trenches, wherein forming the insulating layer for device isolation includes steps of:

removing the oxide layer forming an insulating layer on the entire surface of the semiconductor substrate to completely fill the first trench and the second trench; and etching the insulating layer by CMP such that the insulating layer remains only inside the first and second trenches.

2. The method of claim 1, wherein the fluorine gas including carbon is formed of $CH_2F_2$ or $C_4F_8/C_5F_8$.

3. The method of claim 1, wherein the insulating layer is formed of an $O_3$ TEOS layer or an HDP (High Density Plasma) oxide layer.

* * * * *